(12) United States Patent
Serban et al.

(10) Patent No.: US 10,859,623 B2
(45) Date of Patent: Dec. 8, 2020

(54) SYSTEMS AND METHODS FOR INSULATION IMPEDANCE MONITORING

(71) Applicant: SCHNEIDER ELECTRIC SOLAR INVERTERS USA, INC., Livermore, CA (US)

(72) Inventors: Emanuel Serban, New Westminster (CA); Cosmin Pondiche-Muresan, Burnaby (CA)

(73) Assignee: SCHNEIDER ELECTRIC SOLAR INVERTERS USA, INC., Livermore, CA (US)

( * ) Notice: Subject to any disclaimer, the term of this patent is extended or adjusted under 35 U.S.C. 154(b) by 873 days.

(21) Appl. No.: 15/026,339

(22) PCT Filed: Nov. 6, 2013

(86) PCT No.: PCT/US2013/068760
§ 371 (c)(1),
(2) Date: Mar. 31, 2016

(87) PCT Pub. No.: WO2015/069238
PCT Pub. Date: May 14, 2015

(65) Prior Publication Data
US 2016/0245855 A1    Aug. 25, 2016

(51) Int. Cl.
*G01R 31/08* (2020.01)
*H02M 3/156* (2006.01)
(Continued)

(52) U.S. Cl.
CPC .......... *G01R 31/086* (2013.01); *G01R 15/12* (2013.01); *G01R 15/14* (2013.01); *G01R 27/02* (2013.01);
(Continued)

(58) Field of Classification Search
CPC ......... H02J 1/00; H03H 1/00; H03H 2210/00; B60L 1/00; B60L 2200/00; H01F 1/00
See application file for complete search history.

(56) References Cited

U.S. PATENT DOCUMENTS

| | | | |
|---|---|---|---|
| 4,896,115 A | 1/1990 | LeMaitre et al. | |
| 5,712,572 A | 1/1998 | Tamechika et al. | |
| (Continued) | | | |

FOREIGN PATENT DOCUMENTS

| | | | |
|---|---|---|---|
| CN | 1280301 A | 1/2001 | |
| CN | 1477747 A | 2/2004 | |
| (Continued) | | | |

OTHER PUBLICATIONS

Notification of Transmittal of the International Search Report and the Written Opinion of the International Searching Authority from corresponding PCT/US2013/068760 dated Mar. 25, 2014.
(Continued)

*Primary Examiner* — Jermele M Hollington
*Assistant Examiner* — Temilade S Rhodes-Vivour
(74) *Attorney, Agent, or Firm* — Lando & Anastasi, LLP

(57) ABSTRACT

At least one aspect of the disclosure is directed to a power conversion unit (PCU). The PCU includes a power converter circuit, a safety detection circuit including a plurality of known network impedances and a switch having a first end coupled between two of the plurality of network impedances and a second end coupled to an output terminal, and a controller communicatively coupled to the safety detection circuit and the at least one power converter circuit. The controller may be configured to operate the switch, determine one or more voltage values of the safety detection circuit, and calculate an insulation impedance based at least in part on the one or more voltage values, a position of the switch, and the plurality of known network impedances.

21 Claims, 7 Drawing Sheets

(51) Int. Cl.
    *G01R 31/40*    (2020.01)
    *G01R 27/02*    (2006.01)
    *H02M 1/32*    (2007.01)
    *G01R 15/12*    (2006.01)
    *G01R 15/14*    (2006.01)
    *H02M 3/158*    (2006.01)
    *H02M 3/157*    (2006.01)
    *G01R 31/50*    (2020.01)

(52) U.S. Cl.
    CPC ........... *G01R 27/025* (2013.01); *G01R 31/40* (2013.01); *H02M 1/32* (2013.01); *H02M 3/156* (2013.01); *G01R 31/50* (2020.01); *H02M 3/157* (2013.01); *H02M 3/1584* (2013.01)

(56) References Cited

U.S. PATENT DOCUMENTS

| | | |
|---|---|---|
| 6,794,879 B2 | 9/2004 | Lawson et al. |
| 7,103,486 B2 | 9/2006 | Tian |
| 9,236,827 B2 | 1/2016 | Enomoto et al. |
| 2003/0030446 A1* | 2/2003 | Wang ............... G01R 31/50 324/525 |
| 2006/0268898 A1 | 11/2006 | Karam |
| 2006/0285366 A1* | 12/2006 | Radecker ......... H02M 3/33507 363/16 |
| 2007/0176604 A1 | 8/2007 | Morimoto |
| 2011/0216452 A1* | 9/2011 | Haines ............... H02H 3/00 361/42 |
| 2011/0227584 A1 | 9/2011 | Beck |
| 2012/0049630 A1 | 3/2012 | Hofheinz |
| 2012/0119754 A1* | 5/2012 | Brenk ............... G01R 27/18 324/551 |
| 2012/0153732 A1* | 6/2012 | Kurs ............... H03H 7/40 307/104 |
| 2012/0235567 A1 | 9/2012 | Karalis et al. |
| 2012/0299386 A1* | 11/2012 | Kaufman ............ H02J 1/12 307/82 |
| 2013/0169269 A1 | 7/2013 | Bickel et al. |
| 2013/0221744 A1* | 8/2013 | Hall ............... H02J 7/0047 307/9.1 |
| 2013/0334892 A1* | 12/2013 | Hall ............... H02J 5/005 307/104 |
| 2014/0114591 A1* | 4/2014 | Broeckmann ...... G01R 31/1272 702/58 |

FOREIGN PATENT DOCUMENTS

| | | |
|---|---|---|
| CN | 103105537 A | 5/2013 |
| DE | 102005030907 A1 | 1/2007 |
| DE | 102011007222 A1 | 10/2012 |
| EP | 2333568 A1 | 6/2011 |
| WO | 2012120683 A1 | 9/2012 |
| WO | 2013018411 A1 | 2/2013 |

OTHER PUBLICATIONS

Extended European Search Report from corresponding European Application No. 13897122.1 dated Jun. 22, 2017.

* cited by examiner

SYSTEMS AND METHODS FOR INSULATION IMPEDANCE MONITORING

CROSS-REFERENCE TO RELATED APPLICATIONS

This application is a U.S. National Stage Application under 35 U.S.C. § 371 of International Application No. PCT/US2013/068760, filed Nov. 6, 2013, titled SYSTEMS AND METHODS FOR INSULATION IMPEDANCE MONITORING, which is hereby incorporated herein by reference in its entirety.

BACKGROUND

Technical Field

Embodiments of the present disclosure relate generally to insulation impedance monitoring. More specifically, embodiments relate to systems and methods for measuring the insulation impedance in power conversion units (PCU).

Background Discussion

Power systems typically operate at high voltages relative to protective earth (PE). These power systems generally include insulation between the high voltage conductors and PE. The insulation between the high voltage conductors and PE may degrade over time. As the insulation degrades, current may flow from the energized conductors to PE and thereby create an insulation fault condition. Direct contact with a metal component bonded to PE during an insulation fault condition may cause a deadly amount of current to flow through a human body. Therefore, insulation faults between hazardous voltages in power systems and PE typically need to be detected and isolated. Various safety standards may, for example, set a minimum insulation impedance threshold between the input port of the PCU and PE.

SUMMARY

According to at least one aspect, a power conversion unit (PCU) is provided. The PCU comprises a power converter circuit, a safety detection circuit including a plurality of known network impedances and a switch having a first end coupled between two of the plurality of network impedances and a second end coupled to an output terminal, and a controller communicatively coupled to the safety detection circuit and the at least one power converter circuit, the controller being configured to operate the switch, determine one or more voltage values of the safety detection circuit, and calculate an insulation impedance based at least in part on the one or more voltage values, a position of the switch, and the plurality of known network impedances.

In one embodiment, the controller is further configured to operate the switch at an adjustable frequency. The controller may also be further configured to determine an input voltage at one or more input ports, determine an output voltage value at one or more output ports, and determine a voltage of protective earth (PE) relative to the output terminal. In addition, the controller may be further configured to determine the insulation impedance at least in part by multiplying the voltage of PE relative to the output terminal by a variable gain.

In one embodiment, the PCU further comprises a plurality of DC input ports and a DC output port and wherein the power conversion circuit is constructed to perform a DC-DC power conversion. In this embodiment, the second end of the switch may be coupled to a positive output DC terminal. In addition, the second end of the switch may be coupled to a negative output DC terminal. The PCU may further comprise a plurality of safety detection circuits and wherein each DC input port of the plurality of DC input ports is coupled to at least one safety detection circuit of the plurality of safety detection circuits. The safety detection circuit may be coupled between a positive terminal and a negative terminal of the output DC port.

In one embodiment, the at least one power converter circuit includes at least one DC-DC power converter circuit. In this embodiment, the at least one power converter circuit may include at least one boost power converter circuit.

According to another aspect, a method of monitoring insulation impedance associated with a power conversion unit (PCU) having one or more input ports and one or more output ports is provided. The method comprises measuring one or more voltage values associated with the PCU using a controller, operating a switch communicatively coupled to the controller and having a first end coupled between two network impedances of a plurality of known network impedances at least in part by changing a state of the switch from a first state to a second state, measuring a voltage value between Protective Earth (PE) and an output port of the one or more output ports while the switch is in the second state, operating the switch communicatively coupled to the controller at least in part by changing the state of the switch from the second state to the first state, measuring a voltage value of PE relative to the output port while the switch is in the first state, and calculating an insulation impedance based on the measured voltage values associated with the PCU, measured voltage values of PE while the switch is in the first state and the second state, and the plurality of known network impedances.

In one embodiment, the act of measuring one or more voltage values includes measuring an input voltage at each of the one or more input ports and measuring an output voltage at each of the one or more output ports. The act of calculating the insulation impedance may further include multiplying the voltage between the output port of the one or more output ports and PE by a variable gain. In addition, the act of calculating the insulation impedance may further include adjusting the variable gain to increase the sensor resolution.

In one embodiment, the method of monitoring insulation impedance further comprises determining a total leakage current based at least in part on the calculated insulation impedance. In this embodiment, the method may further comprise comparing the calculated insulation impedance value to a predetermined threshold.

According to another aspect, a power conversion unit (PCU) is provided. The PCU comprises an input to receive input power having a first form, an output to provide output power having a second form, and means, coupled between the input and the output, for determining insulation impedance between the input and protective earth (PE) based on one or more voltage values within the PCU.

In one embodiment, the means for determining insulation impedance includes a plurality of network impedances and at least one switch. In addition, the first form may include DC power at a first voltage level and the second form may include DC power at a second voltage level, the second voltage level being higher than the first voltage level.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed subject matter. Particular references to examples and embodiments, such as "an embodiment," "another embodiment," "some embodiments," "other embodiments," "an alternate embodiment," "various embodiments," "one embodiment," "at least one embodiments," "this and other embodiments" or the like, are not necessarily mutually exclusive and are intended to indicate that a particular feature, structure, or characteristic described in connection with the embodiment or example and may be included in that embodiment or example and other embodiments or examples. The appearances of such terms herein are not necessarily all referring to the same embodiment or example.

Furthermore, in the event of inconsistent usages of terms between this document and documents incorporated herein by reference, the term usage in the incorporated references is supplementary to that of this document; for irreconcilable inconsistencies, the term usage in this document controls. In addition, the accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
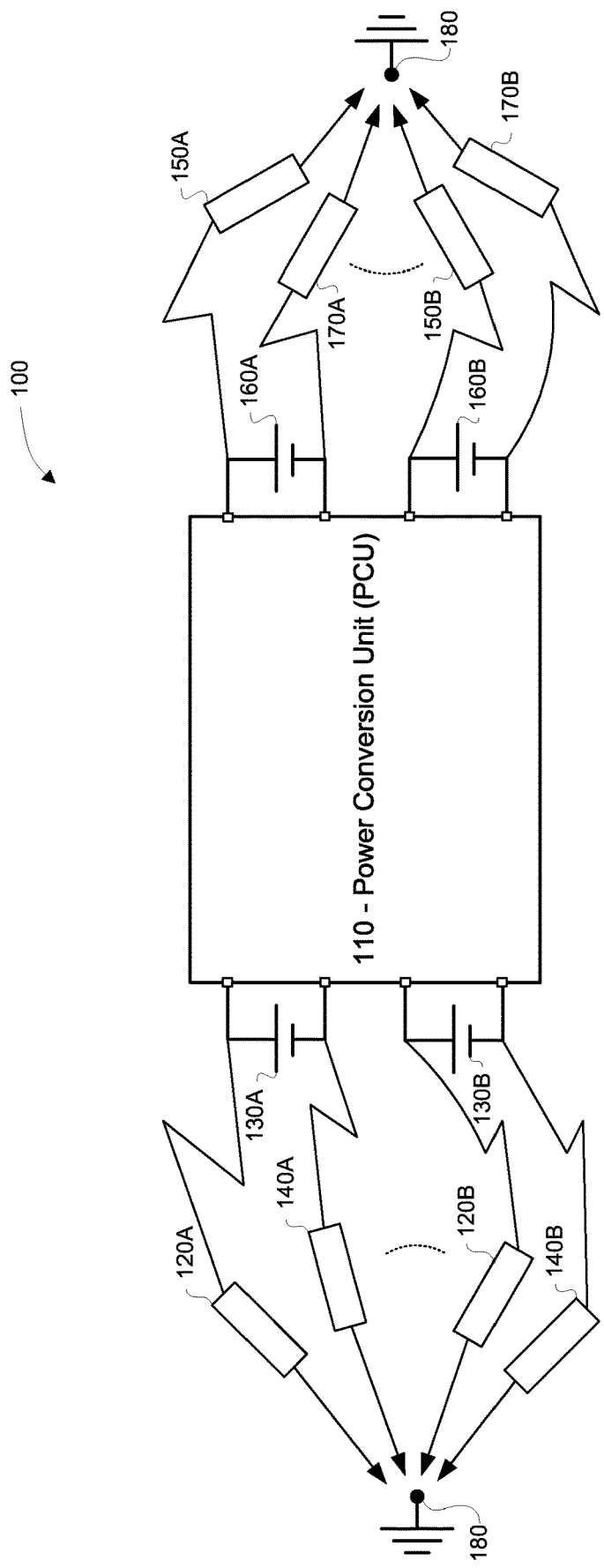
FIG. 1 illustrates one embodiment of a power system block diagram.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

Some embodiments disclosed herein include PCUs with integrated insulation impedance sensing capabilities. Integrating insulation impedance sensing capabilities into the PCU obviates external insulation impedance monitoring systems and/or equipment. In these embodiments, the insulation impedance between an input port of the PCU and PE may be determined based upon a plurality of known parameters within the PCU. For example, various voltage and/or current levels within the PCU may be measured by sensing circuitry and combined with known impedance information of various PCU components. The combined voltage and/or current levels and the known impedance information may be used to form a system of equations with known parameters (e.g., voltage values, current values, impedances, etc.) and unknown parameters (e.g., input insulation impedance).

It is appreciated that a system of equations formed from known parameters within the PCU and unknown input insulation impedance values may not have a sufficient number of known parameters to accurately solve for the unknowns (i.e., the system is an indeterminate system). Additional known parameters may be added to the system by introducing one or more switches into the PCU. The switches introduce multiple states into the PCU measurements that may be leveraged to make an otherwise indeterminate system solvable. Accordingly, various embodiments disclosed herein integrate sensing circuitry, processing circuitry, and one or more switches into a PCU to accurately determine the input insulation impedance based on a plurality of known parameters within the PCU in multiple states.

Example Power Conversion Unit (PCU)

FIG. 1 illustrates one embodiment of a power system block diagram 100. The power system 100 includes a PCU 110, positive or active input terminal insulation impedances 120A and 120B, negative or active input terminal insulation impedances 140A and 140B, input electrical sources 130A and 130B, protective earth (PE) 180, positive or active output terminal insulation impedances 150A and 150B, negative or active output terminal insulation impedances 170A and 170B, and output electrical sources 160A and 160B.

The PCU 110 converts electrical energy from one form to another. For example, the PCU 110 may receive power from one or more generators, modeled as voltage sources 130A and 130B, at a given DC voltage level. The PCU 110 may convert the received power from the generators from a first DC voltage level to a higher second DC voltage level. The output voltage is illustrated as voltage sources 160A and 160B. The PCU 110 is not limited to DC-DC power conversion. PCU 110 may be constructed to perform any type of power conversion including, for example, DC-AC power conversion, AC-DC power conversion, AC-AC power conversion, or DC-DC power conversion.

The PCU 110 includes a plurality of input terminals to receive power. The electrical energy received by the PCU 110 may be at a high voltage level (e.g., 100 Volts, 1000 Volts, etc.). Each of the input ports may have a given amount of insulation between the port and PE 180. The input insulation impedances are illustrated by positive terminal input insulation impedances 120A and 120B and negative terminal input insulation impedances 140A and 140B. The input insulation impedances 120A, 120B, 140A, and 140B may degrade over time and cause leakage current to flow from the PCU 110 inputs to PE 180. Therefore, the input insulation impedances 120A, 120B, 140A, and 140B are typically monitored to ensure that the input insulation impedances 120A, 120B, 140A, and 140B do not degrade to the point where a dangerous amount of leakage current from the input terminals to PE 180. The total insulation impedance of the input port is a function of the individual insulation impedances 120A, 120B, 140A, and 140B. The total insulation impedance of the input port may be represented by the following equation:

$$Z_{tk}^{in} = \frac{1}{\sum_{k=1}^{i}\left(\frac{1}{Z_{xp.k}^{in}} + \frac{1}{Z_{xn.k}^{in}}\right)} \quad (1)$$

In equation (1), $Z_{xp.k}^{in}$ is the insulation impedance between a positive terminal of an input k and PE 180 while $Z_{xn.k}^{in}$ is the insulation impedance between a negative terminal of an input k and PE 180. Applying equation (1) to the embodiment illustrated in FIG. 1, the summation contains the terms $Z_{xp.1}^{in}$, $Z_{xp.2}^{in}$, $Z_{xn.1}^{in}$, and $Z_{xn.2}^{in}$ where the terms represent the impedance values of elements 120A, 120B, 140A, and 140B respectively.

The PCU 110 also includes a plurality of output terminals to output power. The electrical energy output by the PCU 110 may also be at a high voltage level. As described above with respect to the input ports of the PCU 110, each of the output ports may also have a given amount of insulation between the port and PE 180. The insulation impedance between the output ports and PE 180 is illustrated by positive terminal output insulation impedances 150A and 150B and negative terminal output insulation impedances 170A and 170B. The total insulation impedance of the output port is also a function of the individual insulation impedances 150A, 150B, 170A, and 170B. The total insulation impedance of the output port may be calculated using the following relationship:

$$Z_{tk}^{out} = \frac{1}{\sum_{k=1}^{i}\left(\frac{1}{Z_{yp.k}^{out}} + \frac{1}{Z_{yn.k}^{out}}\right)} \quad (2)$$

In equation (2), $Z_{yp.k}^{out}$ is the insulation impedance between a positive terminal of an output k and PE 180 while $Z_{yn.k}^{out}$ is the insulation impedance between a negative terminal of an output k and PE 180. Applying equation (2) to the embodiment illustrated in FIG. 1, the summation contains the terms $Z_{yp.1}^{out}$, $Z_{yp.2}^{out}$, $Z_{yn.1}^{out}$, and $Z_{yn.2}^{out}$ where they represent the impedance values of elements 150A, 150B, 170A, and 170B respectively.

Figure 2A:
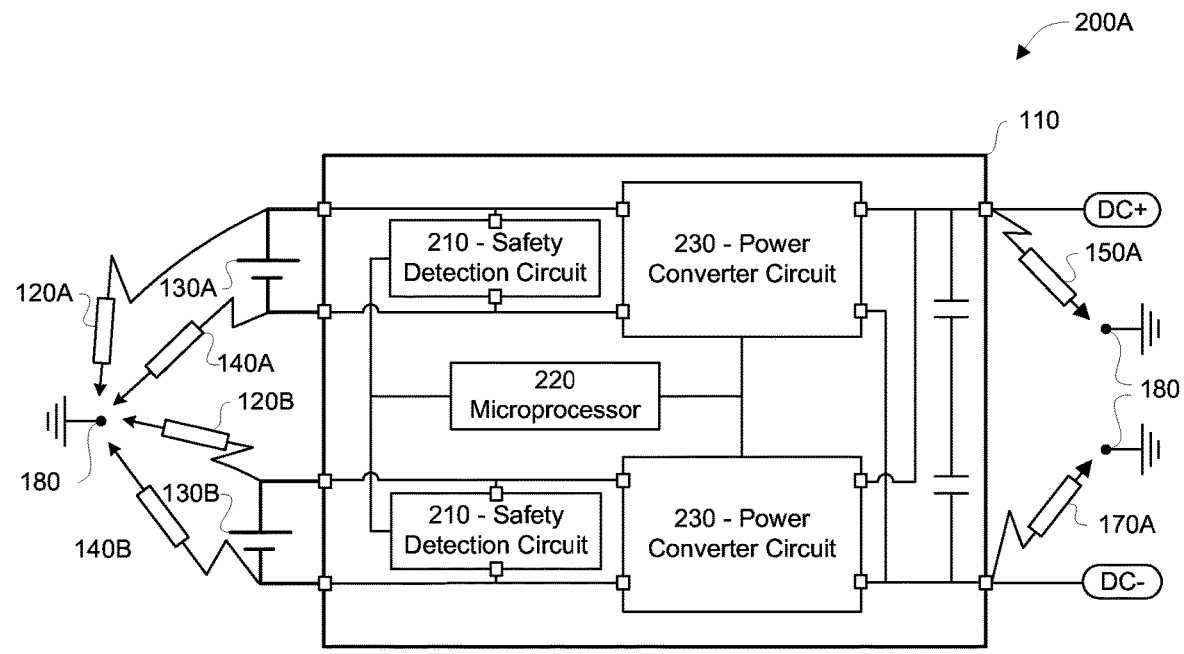
FIGS. 2A and 2B illustrate other embodiments of a power system block diagram.
Figure 2B:
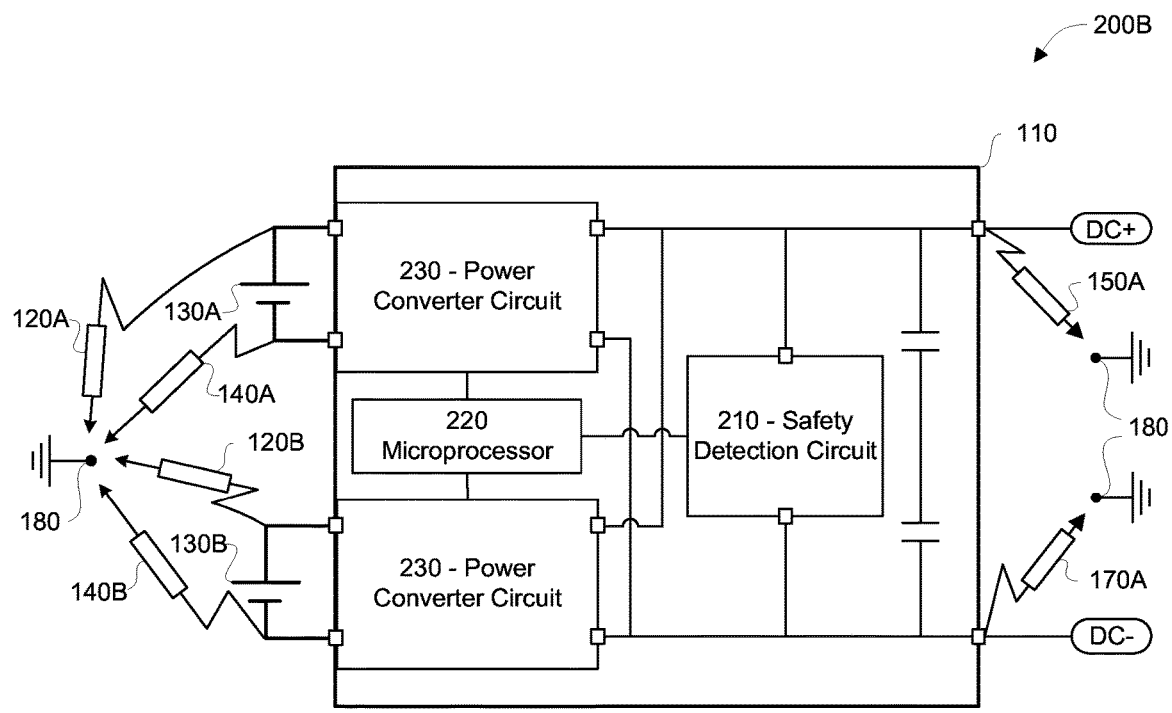

FIGS. 2A and 2B illustrate power systems 200A and 200B in accordance with other embodiments. Each of power systems 200A and 200B includes a PCU 110, positive input terminal insulation impedances 120A and 120B, negative input terminal insulation impedances 140A and 140B, input electrical sources 130A and 130B, protective earth (PE) 180, positive output terminal insulation impedance 150A, negative output terminal insulation impedance 170A, safety detection circuits 210, a microprocessor 220, and power converter circuits 230.

The PCU 110 in power systems 200A and 200B each includes a power converter circuit 230 coupled to each input port. The power converter circuits 230 perform a DC-DC power conversion on the incoming power at each input port. The outputs of the power converter circuits 230 are coupled to the common DC output port. The power converter circuits 230 and subsequently PCU 110 may be constructed to perform any power conversion (e.g., AC-DC, DC-AC, etc.) and is not limited to DC-DC power conversion or the specific circuit topology illustrated in FIGS. 2A and 2B.

The microprocessor 220 in power systems 200A and 200B is communicatively coupled to each safety detection circuit 210 and each power converter circuit 230. The microprocessor 220 may be configured to measure one or more voltage and/or current values associated with the PCU 110. The microprocessor 220 may then calculate an insulation impedance value based at least in part on the measures voltage and/or current values. Example processes performed by the microprocessor 220 are illustrated in the Example Insulation Impedance Monitoring Processes section and FIGS. 6 and 7 described further below.

Figure 7:
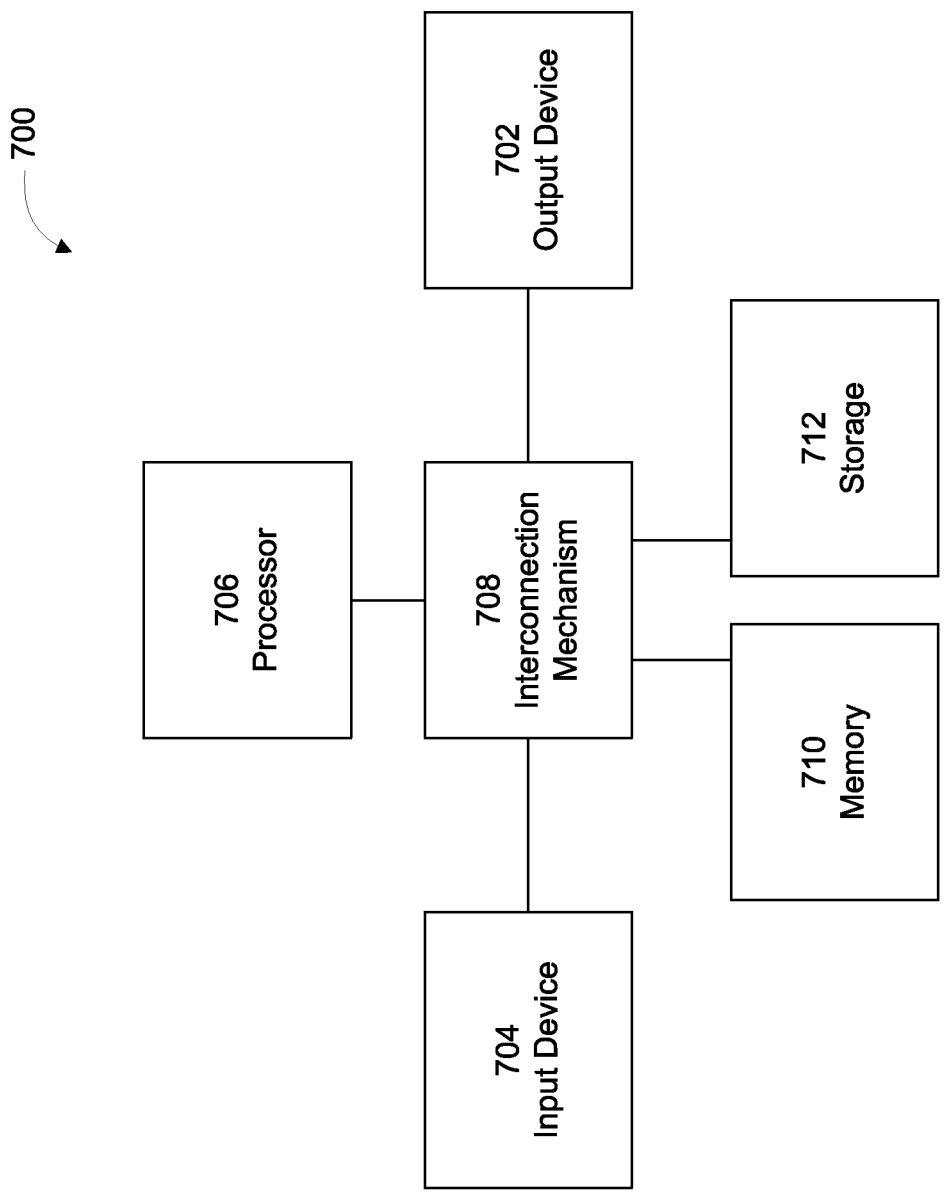
FIG. 7 is a block diagram of one example of a computer system upon which various aspects of the present embodiments may be implemented.

The microprocessor 220 may be computer-based such as the computer system 700 of FIG. 7. In these embodiments, one or more A/D converters and/or D/A converters may be employed to facilitate the bi-directional communication of a processor within the computer system 700 and analog circuitry within the PCU 110.

The PCU 110 construction in power system 200A includes two safety detection circuits 210. The safety detection circuits 210 are located between the positive and negative terminals of each input port of the PCU 110. The safety detection circuit 210 includes sensing circuitry to measure one or more voltage and/or current values within the PCU 110. Accordingly, each of the safety detection circuits 210 is communicatively coupled to the microprocessor 220. The microprocessor may, for example, receive information indicative of various voltage and/or current values within the PCU 110. The microprocessor may also send instructions to control one or more components (e.g., switches) within each safety detection circuit 210.

The PCU 110 construction in power system 200B includes one safety detection circuit 210 that is placed between the positive and negative terminals of the output port of PCU 110. As described above with respect to the PCU 110 in power system 200A, the safety detection circuit includes sensing circuitry to measure one or more voltage and/or current values within the PCU 110. The PCU 110 construction in power system 200B offers a simpler implementation and reduced complexity of PCU 110. The PCU 110, however, may not be able to measure the insulation impedance with the same level of accuracy as PCU 110 in power system 200A that employs a plurality of safety detection circuits 210.

Figure 3:
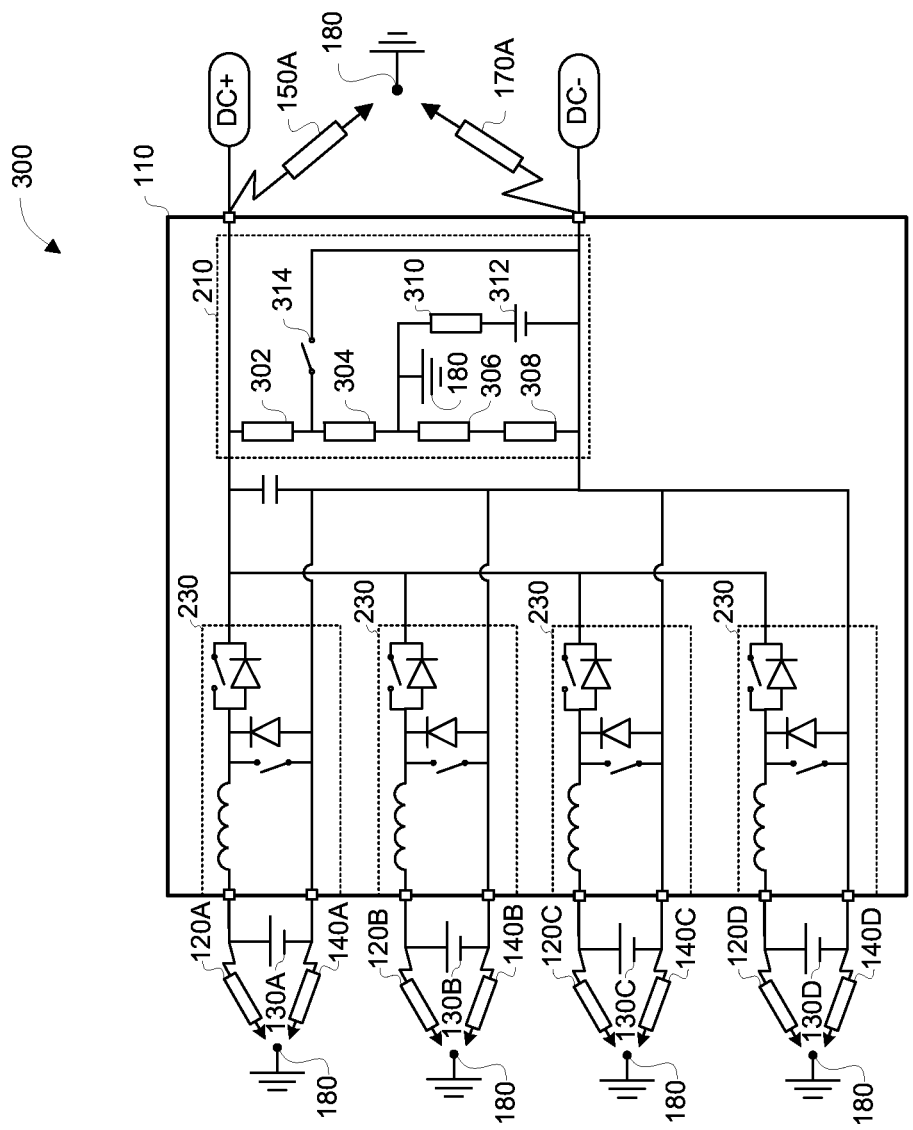
FIG. 3 illustrates one embodiment of a power system equivalent circuit.

FIG. 3 illustrates one embodiment of an equivalent circuit of a power system 300. The power system 300 includes a PCU 110, positive input terminal insulation impedances 120A, 120B, 120C, and 120D, negative input terminal insulation impedances 140A, 140B, 140C, and 140D, input electrical sources 130A, 130B, 130C, and 130D, protective earth (PE) 180, positive output terminal insulation impedance 150A, negative output terminal insulation impedance 170A, and power converter circuits 230. The PCU 110 further comprises a safety detection circuit 210 that includes network impedances 302, 304, 306, and 308, a total equivalent impedance 310, an equivalent voltage source 312, and a switch 314. It is appreciated that the PCU 110 also includes a microprocessor (not shown) communicatively coupled to the safety detection circuit 210 and the power converter circuit 230.

The power converter circuits 230 in PCU 110 are DC-DC boost converters that increase the DC voltage of the incoming power. The power converter circuits 230 are each coupled to one of the four input ports and the common output port. It is appreciated that the power converters 230 may be communicatively coupled to a microprocessor to, for example, receive instructions to open or close the two switches within the power converter circuits 230. The power converters 230 are not limited to the particular type or construction illustrated in FIG. 3.

The safety detection circuit 210 is coupled between the positive output DC terminal and the negative output DC terminal. The safety detection circuit 210 includes sensing circuitry to measure one or more voltage and/or current values within the PCU 110. The sensing circuitry may be comprised of resistors and differential amplifiers with known impedances. The sensing circuitry within the safety detection circuit 210 may be modeled as a set of network impedances 302, 304, 306, 308, and 310 in addition to a voltage source 312. The network impedances 302, 304, 306, and 308 are known impedances based upon the sensing circuitry within the safety detection circuit 210. PE 180 is coupled between known network impedances 304 and 306. PE is further coupled to impedance 310. The total equivalent impedance 310 is a total equivalent impedance of the system. The total equivalent impedance includes both known and unknown terms. The total equivalent impedance may be represented by the following equation:

$$Z_e^{tot} = \frac{1}{\frac{1}{Z_{lk}^{in}} + \frac{1}{Z_{int}^{in.sns}}} + \frac{1}{\frac{1}{Z_{lk}^{out}} + \frac{1}{Z_{int}^{out.sns}}} \qquad (3)$$

In equation (3), $Z_{lk}^{in}$ is the insulation impedance at the input port illustrated in equation (1) while $Z_{lk}^{out}$ is the insulation impedance at the output port illustrated in equation (2). The $Z_{int}^{in.sns}$ and $Z_{int}^{out.sns}$ terms are known network impedances representative of the sensing circuitry. It is appreciated that the equivalent voltage 312 is a known or directly measurable parameter of the system.

The safety detection circuit further includes a switch 314 to short the node between network impedances 302 and 304 to the negative terminal of the output DC port. The switch 314 may be any kind of switch including, but not limited to, a relay, an insulated-gate bipolar transistor (IGBT), a metal-oxide semiconductor field-effect transistor (MOSFET), or a silicon-controlled rectifier (SCR). The switch 314 may be communicatively coupled to a microprocessor (e.g., microprocessor 220). The switch 314 creates multiple states (e.g., an off-state and an on-state) where measurements (e.g., voltage measurements) can be taken to determine the value of the unknown insulation impedances. An example calculation employed by, for example, the microprocessor to calculate the unknown insulation impedance is described further below with reference to the Example Insulation Impedance Monitoring Processes section and FIG. 7.

Figure 4A:
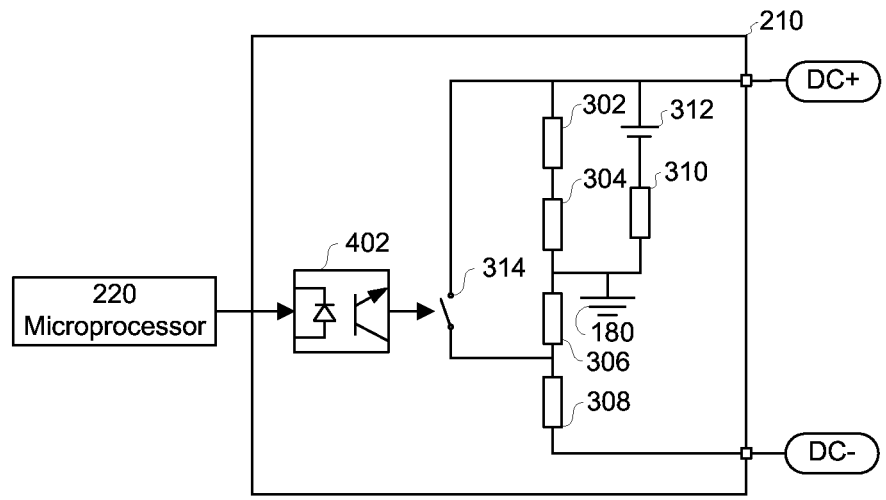
FIGS. 4A and 4B illustrate various embodiments of a safety detection circuit equivalent circuit.
Figure 4B:
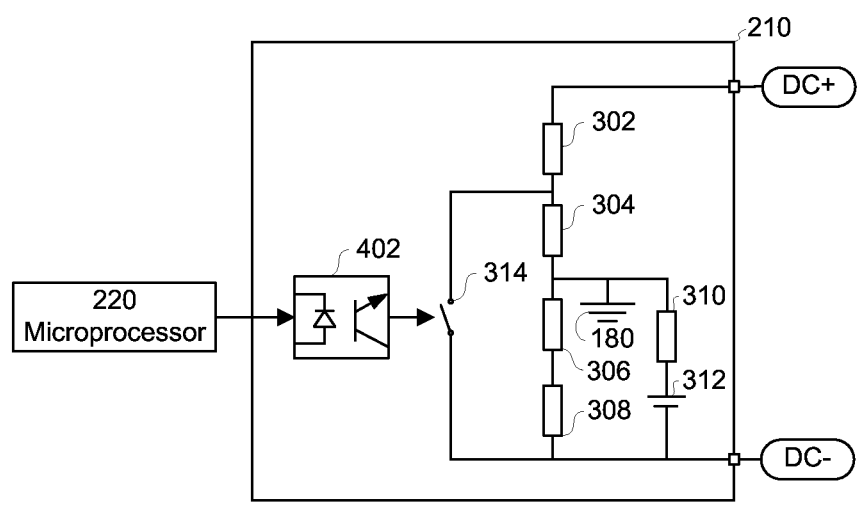

FIGS. 4A and 4B illustrate equivalent circuits of various embodiments of the safety detection circuit 210. Each safety detection circuit 210 illustrated in FIGS. 4A and 4B includes network impedances 302, 304, 306, and 308, a total equivalent impedance 310, an equivalent voltage source 312, switch 314, and gate driver circuit 402 communicatively coupled to microprocessor 220.

In the embodiment illustrated in FIG. 4A, the switch 314 has a first end coupled between network impedances 306 and 308 and a second end coupled to the positive output DC terminal. FIG. 4B illustrates an alternative construction of the safety detection circuit 210 where the switch 314 has a first end coupled between network impedances 302 and 304 and a second end coupled to the negative output DC terminal. As described above, the switch 314 may be controlled by the microprocessor 220 in accordance with an insulation impedance monitoring process to calculate insulation impedances associated with PCU 110.

Example Insulation Impedance Monitoring Processes

Figure 5:
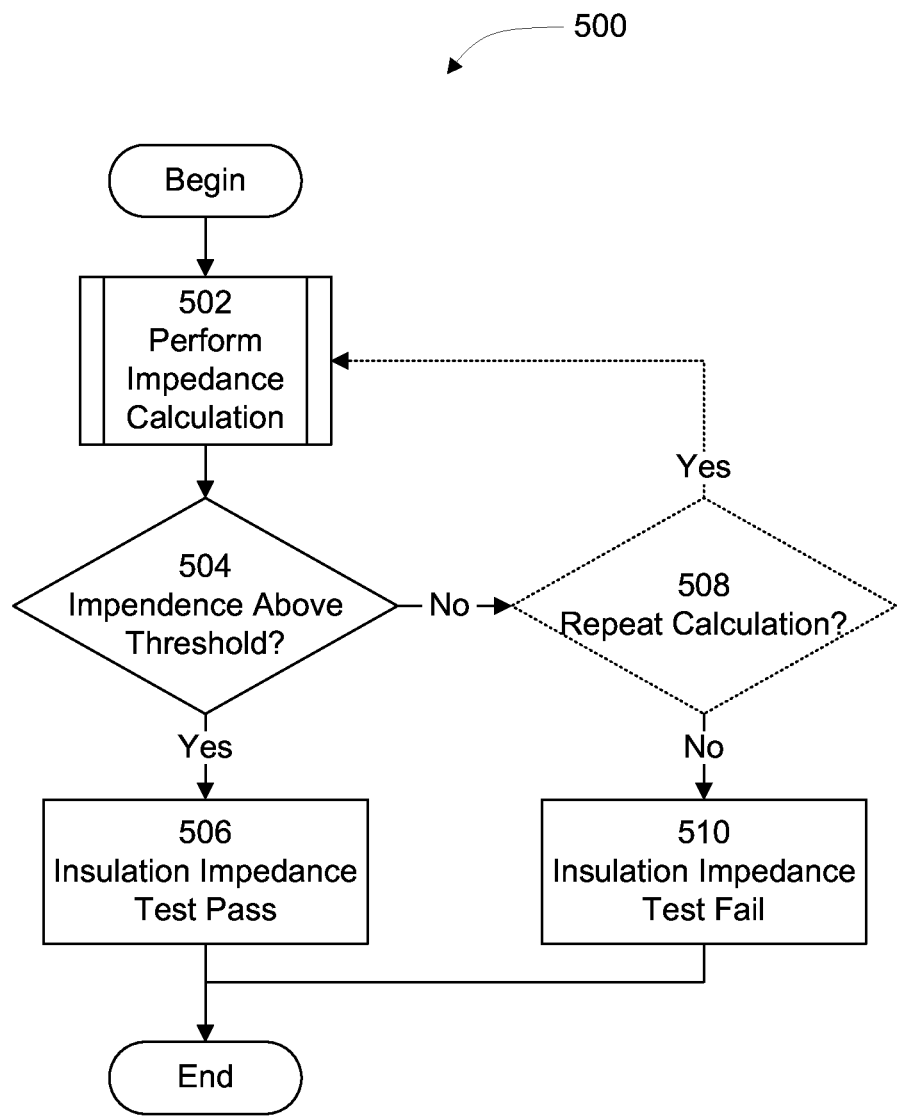
FIG. 5 is a flow diagram of one example method of insulation impedance testing.

As described above with reference to FIGS. 1 and 2, several embodiments perform processes which determine one or more insulation impedance values. In some embodiments, these insulation impedance test processes are executed by a microprocessor-based computer system, such as the PCU 110 described above with reference to FIGS. 1 and 2 or the computer system 700 described below with reference to FIG. 7. FIG. 5 illustrates one example insulation impedance test process 500 performed by a PCU 110 (e.g., executed by microprocessor 220 of PCU 110). The insulation impedance calculation process 500 may be performed before the PCU 110 begins converting power and/or during power conversion. The PCU 110 may include an additional selective block to differentiate between fault currents and natural current harmonics caused by PCU topology to more accurately calculate the insulation impedances during power conversion. The insulation impedance calculation process 500 begins in act 502.

In act 502, the PCU 110 performs an insulation impedance calculation. The insulation impedance calculation includes measuring one or more voltage and/or current values associated with the PCU 110 and operating a switch (e.g., switch 314) to solve for the unknown insulation impedance. The act 502 is described further below with reference to the insulation impedance calculation process 600 illustrated by FIG. 6.

In act 504, the PCU 110 compares the insulation impedance value calculated in act 502 with a threshold value. The threshold value may be consistent with one or more power converter standards. For example, the threshold may be set to a minimum 1kΩ/kV threshold as required by the VDE 0126-1-1 standard for transformer-less photovoltaic PCUs. If the calculated insulation impedance is above the threshold value, the PCU 110 proceeds to act 506 and signals an insulation impedance test pass. Otherwise, the PCU 110 may proceed to optional act 508 and determine whether to repeat act 502 of performing an impedance calculation or proceed directly to act 510 and signal an insulation impedance test failure.

In act 508, the PCU 110 determines whether to repeat act 502 of performing an insulation impedance calculation. In one embodiment, the PCU 110 may require a minimum number of impedance failures in act 504 (e.g., three failures) prior to signaling an insulation impedance test failure. In this embodiment, the PCU 110 tracks the number of times the insulation impedance has been calculated in act 502. In act 508, the PCU 110 performs another impedance calculation in act 502 if the PCU 110 has not performed the required number of insulation impedance calculations. Otherwise, the PCU 110 proceeds to act 510 and signals an insulation impedance test failure.

Figure 6:
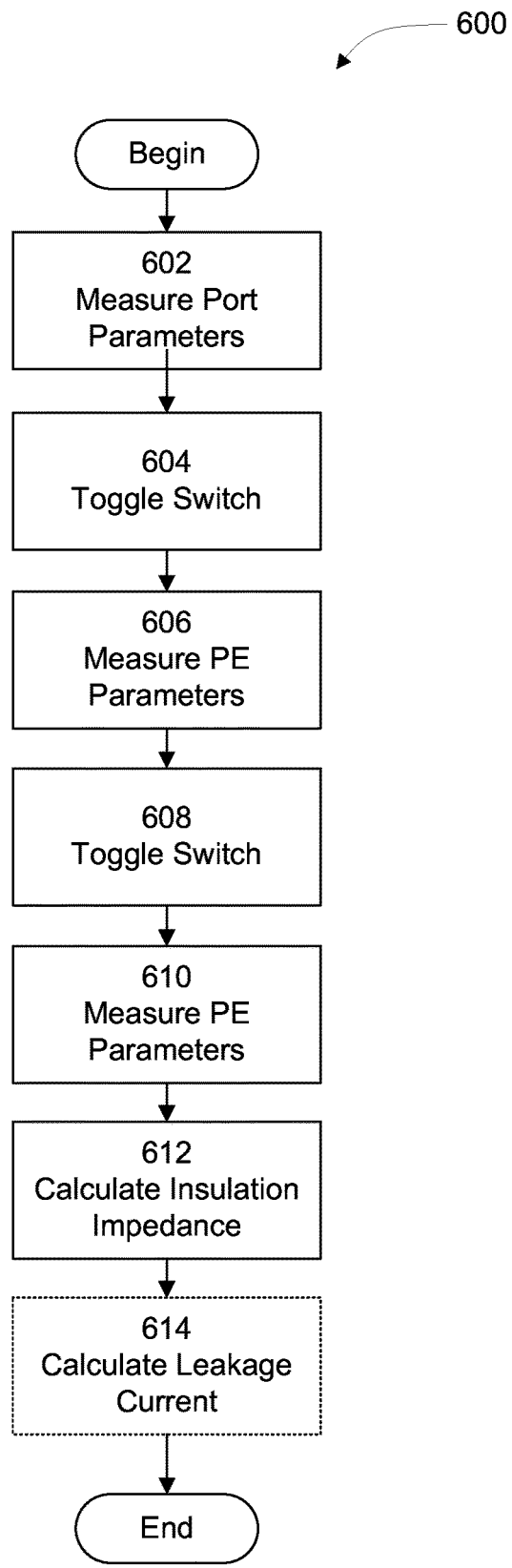
FIG. 6 is a flow diagram of one example method of performing an insulation impedance calculation.

As discussed above with reference to act 502 of performing an impedance calculation, some embodiments perform processes through which the PCU 110 executes an insulation impedance subroutine. One example of an insulation impedance calculation subroutine 600 is illustrated in FIG. 6.

In act 602, the PCU 110 conducts one or more voltage measurements and current measurements associated with the input and output ports. In the embodiment illustrated in FIG. 3, for example, a microprocessor may monitor the voltages at both terminals of each input and output port.

In act 604, the PCU 110 toggles a switch within the safety detection circuit. In the embodiment illustrated in FIG. 3, for example, a microprocessor toggles switch 314 between an open state and a closed state to connect the negative output DC terminal to the second end of network impedance 302 while the first end of network impedance 302 remains connected to the positive output DC terminal.

In act 606, the PCU 110 measures the voltage value of PE relative to a terminal of an output DC bus. In the safety detection circuit 210 illustrated in FIG. 3, for example, the voltage of PE is measured relative to the negative DC bus output terminal. The measured voltage between PE and the negative DC bus output terminal may be amplified by a variable gain. The variable gain value may be a function of the source voltage. For example, the variable gain may be increased for lower source voltage values and decreased for higher source voltage values in order to achieve higher sensor resolution.

In act 608, the PCU 110 toggles the state of the switch within the safety detection circuit. In the embodiment illustrated in FIG. 3, for example, the microprocessor toggles switch 314 between a closed state and an open state to disconnect the negative output DC terminal from the second end of network impedance 302 while the first end of network impedance 302 remains connected to the positive output DC terminal.

In act 610, the PCU 110 measures the voltage value of PE relative to a terminal of an output DC bus. In the safety detection circuit 210 illustrated in FIG. 3, for example, the voltage of PE is measured relative to the negative DC bus output terminal. The measured voltage between PE and the negative DC bus output terminal may be amplified by a variable gain. As described above with respect to act 606, the variable gain may be a function of the source voltage. The PCU 110 may use the same gain value in acts 610 and 606.

In one embodiment, the frequency at which the PCU 110 opens and closes the switch 314 in acts 606 and 610 may be adjustable. The frequency of the switching operations may be adjusted to reduce the variation in the determined voltage of PE relative to an output terminal when the switch 314 is in an open state verse a close state. For example, the switching frequency may be adjusted to reduce the voltage variation between the open and closed states to less than 1%.

In act 612, the PCU 110 employs one or more relationships to calculate the total insulation impedance of the input port of the PCU 110. The total insulation of the input port may be represented by the following relationship:

$$Z_{tk}^{in} = \frac{1}{\frac{1}{Z_e^{tot}} - \frac{1}{Z_{int}^{sns}}} \quad (4)$$

In equation (4), the $Z_e^{tot}$ term is the equivalent total insulation impedance illustrated by equation (3) and element 310 while the $Z_{int}^{sns}$ term is a known network impedance of the sensing circuitry. The $Z_{int}^{sns}$ term may be comprised of internal input and output impedances of the sensing circuitry (i.e., $Z_{int}^{in.sns}$ and $Z_{int}^{out.sns}$ respectively). If output insulation impendence detection is not performed, the internal impedance term $Z_{int}^{sns}$ simplifies to equal only the input impedance of the sensing circuitry term $Z_{int}^{in.sns}$. The $Z_e^{tot}$ term contains both known and unknown parameters. The acts 602, 604, 606, 608, and 610 collect voltage and/or current measurements of the PCU 110 at two different states (e.g., a closed switch state and an open switch state). The voltage and/or current measurements collected during the two different states may be combined to form a system of equations with a sufficient number of known parameters to solve for the input total insulation impedance. In the embodiment illustrated in FIG. 3, for example, the inverse total equivalent impedance term may be computed by the following equation:

$$\frac{1}{Z_e^{tot}} = \frac{\frac{1}{Z_x + Z_y} V_{bus} + \frac{(Z_y + Z_v + Z_z)}{Z_y(Z_v + Z_z)} g V_e^{QDC-} - \frac{(Z_x + Z_y + Z_v + Z_z)}{Z_z(Z_x + Z_y)}}{g V_e^{QDC+} - g V_e^{QDC-}} g V_e^{QDC+} \quad (5)$$

In equation (5), the terms $Z_x$, $Z_y$, $Z_z$, and $Z_v$ represent the impedances of elements 302, 304, 306, and 308 respectively. The $V_{bus}$ term is representative of the voltage between the positive and negative terminals of the DC output port. The g term is representative of the adaptive gain discussed above with respect to acts 606 and 610. The term $V_e^{QDC-}$ is representative of the voltage between PE 180 and the negative terminal of the output DC bus while the switch 314 is off while the term $V_e^{QDC+}$ is representative of the voltage between PE 180 and the negative terminal of the output DC bus which the switch is on.

The inverse total impedance term calculated in equation (5) may be incorporated into equation (4) to yield a final relationship between the measured parameters and the total input insulation impedance. The final relationship is illustrated by the following equation:

$$Z_{lk}^{in} = \frac{1}{\dfrac{1}{Z_x+Z_y}V_{bus} + \dfrac{(Z_y+Z_v+Z_z)}{Z_y(Z_v+Z_z)}gV_e^{QDC-} - \dfrac{\dfrac{(Z_x+Z_y+Z_v+Z_z)}{Z_z(Z_x+Z_y)}}{gV_e^{QDC+} - gV_e^{QDC-}}gV_e^{QDC+} - \dfrac{1}{Z_{int}^{sns}}} \quad (6)$$

In optional act 614, the PCU 110 determines the total input leakage current. The total input leakage current may be computed using the following approximate relation:

$$i_{lk}^{in} = \frac{V_{dc.equiv}^{in}}{Z_{lk}^{in}} = \frac{1}{Z_{lk}^{in}} \sum_{k=1}^{i}\left[\frac{V_{xp.k}^{in} + V_{xn.k}^{in}}{i}\right] \quad (7)$$

In equation (7), the $Z_{lk}^{in}$ term may be the value calculated by equation (6). $V_{xp.k}^{in}$ is the voltage between a positive terminal of an input port k and PE 180 while $V_{xn.k}^{in}$ is the voltage between a negative terminal of an input port k and PE 180.

Similar processes and equations may be employed to calculate the output insulation impedance (e.g., $Z_{lk}^{out}$) associated with PCU 110. As discussed above, PCU 110 is not limited to performing DC-DC power conversion. PCU 110 may, for example, perform DC-AC conversion and determine the input insulation impedance and the output insulation impedance for the DC input port and the AC output port respectively. In addition, one or more disconnects (e.g., relays) may be employed to individually connect and disconnect each input or output port within PCU 110. The one or more disconnects may be employed to facilitate the calculation of specific insulation impedance values (e.g., impedances 120A, 120B, 140A, 140B, 150A, and 170A in FIGS. 2A and 2B). For example, all of the input ports may be disconnected except for the first input port. In this example, the total insulation impedance of the input port (i.e., $Z_{lk}^{in}$) is equal to the insulation impedance of the first input port.

Furthermore, various aspects and functions described herein in accord with the present disclosure may be implemented as hardware, software, firmware or any combination thereof. Aspects in accord with the present disclosure may be implemented within methods, acts, systems, system elements and components using a variety of hardware, software or firmware configurations. Furthermore, aspects in accord with the present disclosure may be implemented as specially-programmed hardware and/or software.

Example Computer System

Referring to FIG. 7, there is illustrated a block diagram of one example of computing components forming a system 700 which may be configured to implement one or more aspects disclosed herein. For example, the system 700 may be communicatively coupled to a PCU or included within a PCU and configured to perform an insulation impedance test as described above with reference to the Example Insulation Impedance Monitoring Processes section and FIGS. 5 and 6.

The system 700 may include for example a general-purpose computing platform such as those based on Intel PENTIUM-type processor, Motorola PowerPC, Sun Ultra-SPARC, Texas Instruments-DSP, Hewlett-Packard PA-RISC processors, or any other type of processor. System 700 may include specially-programmed, special-purpose hardware, for example, an application-specific integrated circuit (ASIC). Various aspects of the present disclosure may be implemented as specialized software executing on the system 700 such as that shown in FIG. 7.

The system 700 may include a processor/ASIC 706 connected to one or more memory devices 710, such as a disk drive, memory, flash memory or other device for storing data. Memory 710 may be used for storing programs and data during operation of the system 700. Components of the computer system 700 may be coupled by an interconnection mechanism 708, which may include one or more buses (e.g., between components that are integrated within a same machine) and/or a network (e.g., between components that reside on separate machines). The interconnection mechanism 708 enables communications (e.g., data, instructions) to be exchanged between components of the system 700. Further, in some embodiments the interconnection mechanism 708 may be disconnected during servicing of a PDU.

The system 700 also includes one or more input devices 704, which may include for example, a keyboard or a touch screen. An input device may be used for example to configure the measurement system or to provide input parameters. The system 700 includes one or more output devices 702, which may include for example a display. In addition, the computer system 700 may contain one or more interfaces (not shown) that may connect the computer system 700 to a communication network, in addition or as an alternative to the interconnection mechanism 708.

The system 700 may include a storage system 712, which may include a computer readable and/or writeable nonvolatile medium in which signals may be stored to provide a program to be executed by the processor or to provide information stored on or in the medium to be processed by the program. The medium may, for example, be a disk or flash memory and in some examples may include RAM or other non-volatile memory such as EEPROM. In some embodiments, the processor may cause data to be read from the nonvolatile medium into another memory 710 that allows for faster access to the information by the processor/ASIC than does the medium. This memory 710 may be a volatile, random access memory such as a dynamic random access memory (DRAM) or static memory (SRAM). It may be located in storage system 712 or in memory system 710. The processor 706 may manipulate the data within the integrated circuit memory 710 and then copy the data to the storage 712 after processing is completed. A variety of mechanisms are known for managing data movement between storage 712 and the integrated circuit memory element 710, and the disclosure is not limited thereto. The disclosure is not limited to a particular memory system 710 or a storage system 712.

The system 700 may include a general-purpose computer platform that is programmable using a high-level computer programming language. The system 700 may be also implemented using specially programmed, special purpose hardware, e.g. an ASIC. The system 700 may include a processor 706, which may be a commercially available processor such as the well-known Pentium class processor available from the Intel Corporation. Many other processors are available.

The processor 706 may execute an operating system which may be, for example, a Windows operating system available from the Microsoft Corporation, MAC OS System X available from Apple Computer, the Solaris Operating System available from Sun Microsystems, or UNIX and/or LINUX available from various sources. Many other operating systems may be used.

The processor and operating system together may form a computer platform for which application programs in high-level programming languages may be written. It should be understood that the disclosure is not limited to a particular computer system platform, processor, operating system, or network. Also, it should be apparent to those skilled in the art that the present disclosure is not limited to a specific programming language or computer system. Further, it should be appreciated that other appropriate programming languages and other appropriate computer systems could also be used.

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. A power conversion unit (PCU) comprising:
a power converter circuit;
a safety detection circuit including a plurality of known network impedances and a switch having a first end coupled between two of the plurality of network impedances and a second end coupled to an output terminal; and
a controller communicatively coupled to the safety detection circuit and the power converter circuit, the controller being configured to:
toggle a position of the switch between a first state and a second state;
determine a first set of one or more voltage values of the safety detection circuit while the switch is in the first state and a second set of one or more voltage values of the safety detection circuit while the switch is in the second state; and
calculate an insulation impedance based at least in part on the first set of one or more voltage values, the second set of one or more voltage values, the position of the switch, and the plurality of known network impedances.

2. The PCU of claim 1, wherein the controller is further configured to toggle the switch at an adjustable frequency.

3. The PCU of claim 1, wherein the controller is further configured to determine an input voltage at one or more input ports, determine an output voltage value at one or more output ports, and determine a voltage of protective earth (PE) relative to the output terminal.

4. The PCU of claim 3, wherein the controller is further configured to determine the insulation impedance at least in part by multiplying the voltage of PE relative to the output terminal by a variable gain.

5. The PCU of claim 1, further comprising a plurality of DC input ports and a DC output port and wherein the power conversion circuit is constructed to perform a DC-DC power conversion.

6. The PCU of claim 5, wherein the second end of the switch is coupled to a positive output DC terminal.

7. The PCU of claim 5, wherein the second end of the switch is coupled to a negative output DC terminal.

8. The PCU of claim 5, further comprising a plurality of safety detection circuits and wherein each DC input port of the plurality of DC input ports is coupled to at least one safety detection circuit of the plurality of safety detection circuits.

9. The PCU of claim 5, wherein the safety detection circuit is coupled between a positive terminal and a negative terminal of the output DC port.

10. The PCU of claim 1, wherein the power converter circuit includes at least one DC-DC power converter circuit.

11. The PCU of claim 10, wherein the at least one power converter circuit includes at least one boost power converter circuit.

12. The PCU of claim 1, wherein the controller is further configured to determine a voltage of protective earth relative to the output terminal.

13. A method of monitoring insulation impedance associated with a power conversion unit (PCU) having one or more input ports and one or more output ports, the method comprising:
measuring one or more voltage values associated with the PCU using a controller;
operating a switch communicatively coupled to the controller and having a first end coupled between two network impedances of a plurality of known network impedances at least in part by changing a state of the switch from a first state to a second state;
measuring a voltage value between Protective Earth (PE) and an output port of the one or more output ports while the switch is in the second state;
operating the switch communicatively coupled to the controller at least in part by changing the state of the switch from the second state to the first state;
measuring a voltage value of PE relative to the output port while the switch is in the first state; and
calculating an insulation impedance based on the measured voltage values associated with the PCU, measured voltage values of PE while the switch is in the first state and the second state, and the plurality of known network impedances.

14. The method of claim 13, wherein measuring one or more voltage values includes measuring an input voltage at each of the one or more input ports and measuring an output voltage at each of the one or more output ports.

15. The method of claim 14, wherein calculating the insulation impedance further includes multiplying the voltage between the output port of the one or more output ports and PE by a variable gain.

16. The method of claim 15, wherein calculating the insulation impedance further includes adjusting the variable gain to increase the sensor resolution.

17. The method of claim 13 further comprising determining a total leakage current based at least in part on the calculated insulation impedance.

18. The method of claim 13, further comprising comparing the calculated insulation impedance value to a predetermined threshold.

19. A power conversion unit (PCU) comprising:
an input to receive input power having a first form;
an output to provide output power having a second form;
a plurality of network impedances; and
means, coupled between the input and the output, for determining insulation impedance between the input and protective earth based on a first set of one or more voltage values within the PCU determined based on a first set of network impedances of the plurality of network impedances, and based on a second set of one or more voltage values within the PCU determined based on a second set of network impedances of the plurality of network impedances.

20. The PCU of claim 19, wherein the means for determining insulation impedance includes at least one switch.

21. The PCU of claim 19, wherein the first form includes DC power at a first voltage level and the second form includes DC power at a second voltage level, the second voltage level being higher than the first voltage level.

* * * * *